United States Patent
Razeghi

[11] Patent Number: 6,054,706
[45] Date of Patent: Apr. 25, 2000

[54] LONG WAVELENGTH INFRARED PHOTODETECTORS

[75] Inventor: Manijeh Razeghi, Wilmette, Ill.

[73] Assignee: Northwestern University, Evanston, Ill.

[21] Appl. No.: 09/097,403

[22] Filed: Jun. 15, 1998

[51] Int. Cl.[7] .................................................. H01L 31/00

[52] U.S. Cl. .......................................... 250/214.1; 257/22

[58] Field of Search ............................. 250/214.1, 214 R, 250/338.1, 338.4; 257/22, 21, 441, 443

[56] References Cited

U.S. PATENT DOCUMENTS 6,005,127  12/1999  Todd et al. ............................ 556/70

*Primary Examiner*—Que T. Le
*Attorney, Agent, or Firm*—Welsh & Katz, Ltd.

[57] ABSTRACT

The subject invention includes a far-infrared detector based on $InSbBi_xI_{1-x}$ which operates 12 $\mu$m at room temperature with an energy band gap as low as 0.13 eV (9.3 $\mu$m) at 77K and 12 $\mu$m at 300K. The subject invention may be prepared by growing epitaxial layers of InSbBi on InSb which is grown on a suitable substrate. The wavelength of absorption may be controlled through the variation of the Bi concentration in the InSbBi active layer.

3 Claims, 2 Drawing Sheets

LONG WAVELENGTH INFRARED PHOTODETECTORS

This invention is made with government support under the Office of Naval Research, Contract Nos. # ONR N00014-92-J-1951 and N00014-94-I-0902. The government has certain rights in the invention.

HgCdTe has been the traditional material for long wavelength infrared (LWIR) photodetectors operating in the wavelength range from 8 to 12 $\mu$m. Due to the difficulties in epitaxial growth and processing steps in this II–VI alloy, a number of III–V semiconductor structures, such as InAsSb and metastable InTlSb, InSbBi, InAsBi, InAsSbBi, InTlP, and InTlAs have been investigated as an alternative for LWIR photodetectors. Attractive alternative structures employing InTlSb and InAsSb are described in U.S. Pat. Nos. 5,421,910 and 5,658,825. In spite of the unchanging results of InTlSb and InAsSb LWIR photodetectors, a further reduction of band gap energy is necessary for high performance detector operation. InSbBi, another attractive material system for LWIR applications, has been studied for the past three decades, however, relatively little progress has been made in Bi-containing III–V materials due to the solubility limit of Bi.

Long-wavelength infrared (8–12 $\mu$m) photodetectors operating at room temperature are of great importance for military and civilian applications. As stated above, the infrared material system of choice in this wavelength region has been HgCdTe. However, HgCdTe suffer from thermal instability and poor compositional uniformity over a large area due to the high Hg vapor pressure and weak Hg bond. It is thus highly desirable to develop Sb-based material systems since III–V alloys offer robust material properties and advanced processing technologies. Even though the InAsSb system has been studied extensively, its band gap is not small enough for efficient detector operation in the long-wavelength infrared window where the minimum atmospheric absorption is present.

As an attractive alternative novel InSbBi and InTlSb ternary alloys have been investigated since relatively small incorporation of Bi or Tl into InSb should reach the 8–12 $\mu$m cutoff wavelength needed for LWIR photodetector applications. However, previous efforts to grow InSbBi epitaxial layers have not been completely successful due to the large solid phase miscibility gap between InSb and InBi.

SUMMARY OF THE INVENTION

The subject invention includes a far-infrared detector based on InSbBix1-x which operates 12 $\mu$m at room temperature with an energy band gap as low as 0.13 eV (9.3 $\mu$m) at 77K and 12 $\mu$m and 300K. The subject invention may be prepared by growing epitaxial layers of InSbBi on InSb which is grown on a suitable substrate. The wavelength of absorption may be controlled through the variation of the Bi concentration in the InSbBi active layer.

DETAILED DESCRIPTION OF THE DRAWINGS

The reactor and associated gas-distribution scheme used herein are substantially as described in U.S. Pat. No. 5,384,151. The system comprises a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a hydrogen flow of 4 liters min$^{-1}$, and the working pressure of 78 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20EC, even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

Dopants usable in the method of the subject invention are as follows:

| n dopant | p dopant |
| --- | --- |
| $H_2Se$ | $(CH_3)_2Zn$ |
| $H_2S$ | $(C_2H_5)_2Zn$ |
| $(CH_3)_3Sn$ | $(C_2H_5)_2Be$ |
| $(C_2H_5)_3Sn$ | $(CH_3)_2Cd$ |
| $SiH_4$ | $(\eta C_2H_5)_2Mg$ |
| $Si_2H_6$ | |

The substrate can be GaAs, Si, $Al_2O_3$, MgO, SiC, ZnO, $LiGaO_2$, $LiAlO_2$, $MgAl_2O_4$ or GaN. Preferably, GaAs is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Figure 2:
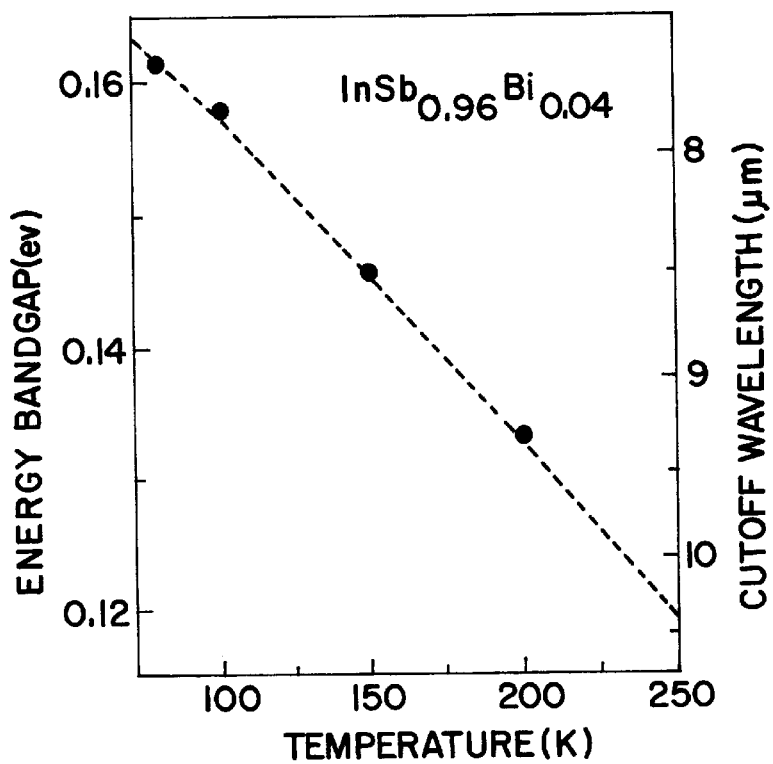
FIG. 2 is a graph of energy bandgap vs temperature of a InSbBi/InSb epitaxial layer.

The invention is described in accordance with the drawings and, in particular, with respect to FIG. 2. FIG. 2 contains a cross-section of a IsSbBi photodetector structure formed in accordance with the subject invention. Other Bi-containing structures such as InAsSbBi and GaInSbBi may also be utilized to form a detector according to the subject invention. Thus, if one adds Ga or As to the ternary structure InSbBi to form a quaternary structure, such should also operate according to the subject invention.

The epitaxial layers for the detector of the subject invention may be grown by low-pressure metallorganic chemical vapor deposition (LP-MOCVD), although MBE, LPE and VPE procedures may be used with equal effect.

Growth takes place in MOCVD procedures by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 500 and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

For best results, all surfaces of the growth reaction chamber are coated with a barrier coating capable of withstanding high temperatures and not reacting with the reactants and dopants utilized therein at such high temperatures. Preferably, a coating of AlN or of SiC is grown in situ in the reaction chamber to cover all surfaces therein. There is thus formed a stable layer that prevents oxygen and other impurities originating within the reaction chamber from reacting with the semiconducting layer to be grown.

Doping is preferably conducted with bis-cyclopentadienyl magnesium $(CH_3)_2Zn$ for p-type doping and silane $(SiH_4)$ for n-type doping. Doping is performed through a $(CH_3)_2Zn$ bubbler with $H_2$ as carrier gas and at temperatures from −15EC to ambient temperatures at 20–90 cm$^3$ min.$^{-1}$ and onto either a hot or cooled substrate (535EC). $SiH_4$ may be simply directed at ambient temperatures onto the hot substrate at 20–90 cm$^3$ min.$^{-1}$.

In a preferred doping method for incorporating the maximum amount of p-type dopant on the layer, once the p-type layer to be doped is fully grown, the heat source is terminated and the substrate allowed to cool; the metal and hydride sources are terminated; the dopant flow, for instance DEMg, is initiated at the temperatures indicated for diffusion onto the cooled substrate/epilayer which has been previously grown. After about 2–3 minutes, the dopant flow is terminated and the next epilayer grown. By this method, it is found that $10^{20}$ atoms/cm$^3$ of Mg may be placed on the top surface of the epilayer.

The InSbBi films of the subject invention were grown on semiinsulating GaAs(001) substrates using a horizontal, rf-heated, LP-MOCVD reactor. Trimethylindium (TMI), timethylantimony (TMSb) and trimethylbismuth (TMBi) were used as precursors of indium, antimony and bismuth, respectively. Palladium-diffused hydrogen was used as a carrier gas with a total flow rate of 1.51 /min. After the InSb buffer layer, InSbBi epilayers were grown on InSb (001) and semi-insulating GaAs (001) substrates by introducing Bi flux into the reactor at the optimum growth conditions of InSb. Growth conditions such as temperature, pressure and V/III ratio were varied to obtain good quality films. The highest Bi concentration in InSb was achieved with the growth temperature of 456CE, growth pressure of 76 Torr and V/III ratio of 13. Growth rate was about 1.3 $\mu$m/h.

The crystalline quality was determined by x-ray diffraction spectra using (004) reflection. Phillips MPD 18I0/HR four crystal high resolution diffractometer was used for obtaining the rocking curves. An energy dispersive x-ray analysis (EDAX) techniques was used to investigate the incorporation of Bi into InSb. EDAX spectrum of $InSb_{0.95}Bi_{0.05}$ layer clearly showed the presence of Bi peak at 204 keV, which corresponds to BiM line (See FIG. 1). The epilayer, with Bi peak in EDAX spectrum, showed a clear shift of x-ray diffraction peak with respect to that of InSb, indicating the significant incorporation of Bi into the crystal lattice. Electrical properties of epilayers have been characterized by Hall measurements using van der Pauw method. Hall data for undoped $InSb_{0.95}Bi_{0.05}$ epilayer exhibit n-type conduction with electron concentration of $2.68 \times 10^{17}$ cm$^{-3}$ and mobility of $4.91 \times 10^3$ cm$^2$/V s at 300 K (See Table I).

TABLE I

Material parameters and room temperature detector performance at 10.6 $\mu$m.

| Parameters at 300 K | $InSb_{0.95}Bi_{0.05}$ |
|---|---|
| n(cm$^{-3}$) | $2.68 \times 10^{17}$ |
| $\mu$(cm$^2$/V s) | $4.91 \times 10^3$ |
| R($\Omega$) | 17 |
| $\eta$ | 0.35 |
| $\tau$(ns) | 0.7 |
| R(mV/W at 10.6 $\mu$m) | 1.9 |
| D*(cm Hz$^{1/2}$/W at 10.6 $\mu$m) | $1.2 \times 10^6$ |

At 77 K. the grown InSbBi epilayer has mobility of $2.73 \times 10^3$ cm$^2$/V s with an electron concentration of $2.43 \times 10^{16}$ cm$^3$. At room temperature (300EK) it has a mobility of $7.32 \times 10^3$ cm$^2$/V s with an electron concentration of $3.57 \times 10^{16}$ cm$^3$. The infrared transmission measurements were performed using a Fourier transform infrared (FTIR) spectrometer (Mattson, Galaxy 3000) with a spectral range of 2.25–25 $\mu$m.

Au/Ti contacts were deposited on the InSbBi epilayers by a e-beam evaporator. The contact pattern was made using a metal mask. The distance between the contacts was 2.25 mm. The photodetectors were mounted onto copper heat sinks and the electrical contact was made by a Au-wire bonding. They were then attached to the cold finger of a liquid nitrogen cooled cryostat equipped with a temperature controller. The resistance of an $InSb_{0.95}Bi_{0.05}$ detector was 147 $\Omega$ at 77 K and 17 $\Omega$ at 300 K. The spectral response was measured under front-side (InSbBi active layer side) illumination using a FTIR spectrometer. The measured response was adjusted by correcting for the slow frequency response of the internal pyroelectric detector. The absolute responsivity was calibrated using a blackbody test setup, including a blackbody source (Mikron, 305), chopper system (Stanford Research System, SR540), and a lock-in amplifier (EG&G, 5209).

Figure 1:
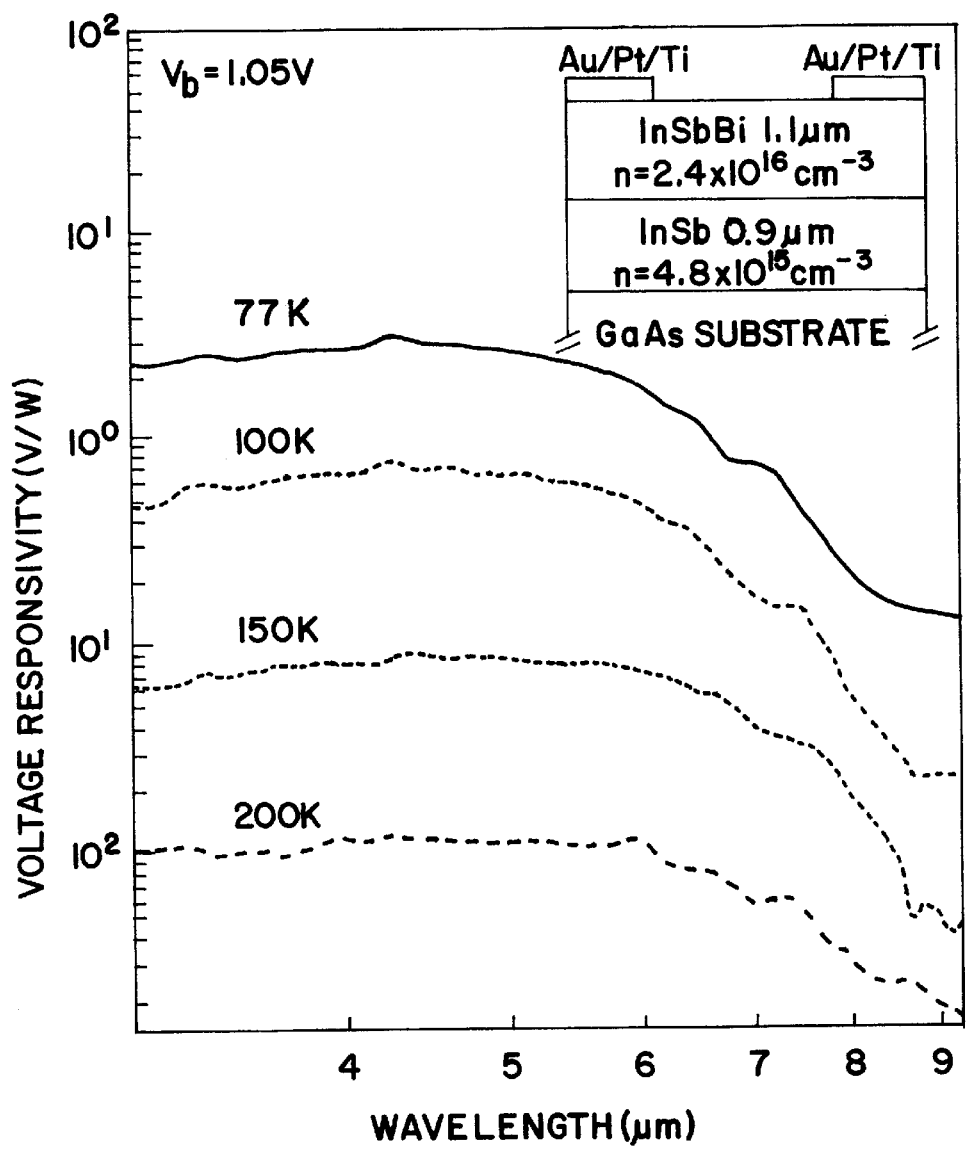
FIG. 1 shows the spectral voltage responsivity InSbBi photodetector at different temperatures.

FIG. 1 shows the measured spectral voltage responsivity of an $InSb_{0.95}Bi_{0.05}$ photoconductor at different temperatures. The responsivity was calibrated with the blackbody source at a temperature of 800 K and at a modulating frequency of 400 Hz. Chopper frequency dependent responsivity measurements showed that the thermal effect could be neglected a t frequencies higher than 200 Hz. As observed in FIG. 1, the spectral photoresponse could be measured up to 12 $\mu$ at room temperature. These measurements were the first observation of a room temperature photoresponse at such a long wavelength from an InSbBi alloy. The responsivity at 10.6 $\mu$m which is important for the application of $CO_2$ laser monitoring, was about 1.9 mV/W at 300 K for 1.74 V bias voltage. The corresponding Johnson noise limited detectivity was estimated to be about $1.2 \times 10^6$ cmHz$^{1/2}$/W. The relatively noisy spectral response may be caused by the noise of the FTIR preamplifier since the contribution of thermal or bolometric response is negligible at the measuring frequencies of FTIR (>1.2 kHz). The inset of FIG. 2 shows the schematic of InSbBi photoconductor used in this study. The photoconductor structure is composed of two epilayers, $InSb_{0.95}Bi_{0.05}/InSb$, grown on semi-insulating GaAs substrate. Growth on GaAs substrates offers the advantage of future monolithic integration with advanced read-out integrated circuit. InSb was used as a buffer layer with 1.8% lattice-mismatch to $InSb_{0.95}Bi_{0.05}$ and also as a confinement layer for carriers in the active layer. The thickness of the InSbBi active layer was 1.1 µm. The confinement layer was doped with Zn.

The spectral response at different temperatures and the schematic of the photodetector fabricated form the grown InSbBi sample are best shown in FIG. 1. The photoresponse cutoff wavelength shifts from 5.5 µm of InSb to 7.7 µm at 77 K and has been extended up to 9.3 µm t 200 K. The band gap of the investigated specimen was determined by the cutoff wavelength form the photoresponse data. The measured band gap was 0.16 eV (7.7 µm) at 77 K. The responsivity decreases with the increasing temperature. The signal-to-noise (S/N) ratio was too weak for adequate measurements at temperatures over 200 K. This decrease of measurements at temperatures over 200 K. This decrease of responsivity and S/N ratio is due to the increase of intrinsic carriers caused by the decrease of the band gap as shown in FIG. 2. The maximum responsivity at 7 µm is about 3.2 V/W at 77 K (see FIG. 4). The corresponding Johnson-noise limited detectivity is bout $4.7 \times 10^8$ cm $Hz^{1/2}$/W.

From the fact that the band-gap energy of the grown InSbBi is deviated only slightly from that of InSb, Vegard's law amy be applied to determine the approximate solid composition. An energy band gap of $-1.5$ eV at 300 K is assumed for the semimetal InBi. The amount of incorporated Bi in the investigated specimen was found to be about 4 at. %. The band-gap energies determined by the photon energy of the cutoff wavelength at different temperatures are shown in FIG. 2. The temperature coefficient of bad-gap energy $dE_g/dT$ for $InSb_{0.95}Bi_{0.05}$ was $-0.25$ meV/K in its linear energy band gap versus temperature region.

As noted in FIG. 2, the wavelength and ev at a given temperature may be effectively controlled by varying the Bi concentration. Thus, as x varies from 0v1 in $InSb_xBi_{1-x}$ the frequency responsivity of the resulting photodetector should increase from 5.5 µm to over 30 µm. One can determine the precise Bi concentration needed to effect responsivity at a given wavelength through the formula $$E = h\nu = hc/\lambda = E_g(t) + E^e_{conf} + E^n_{conf} \quad (2)$$

$E^e_{conf} + E^n_{conf}$ are the confirming energies for the electron and hole ground states respectively, Eg is the energy gap of InBi, λ is the photoluminescence wavelength, h is Planck's constant and c is the speed light in a vacuum. Solving for λ, one gets $$\lambda(rem) = 1.24/E(ev) \quad (3)$$

Figure 3:
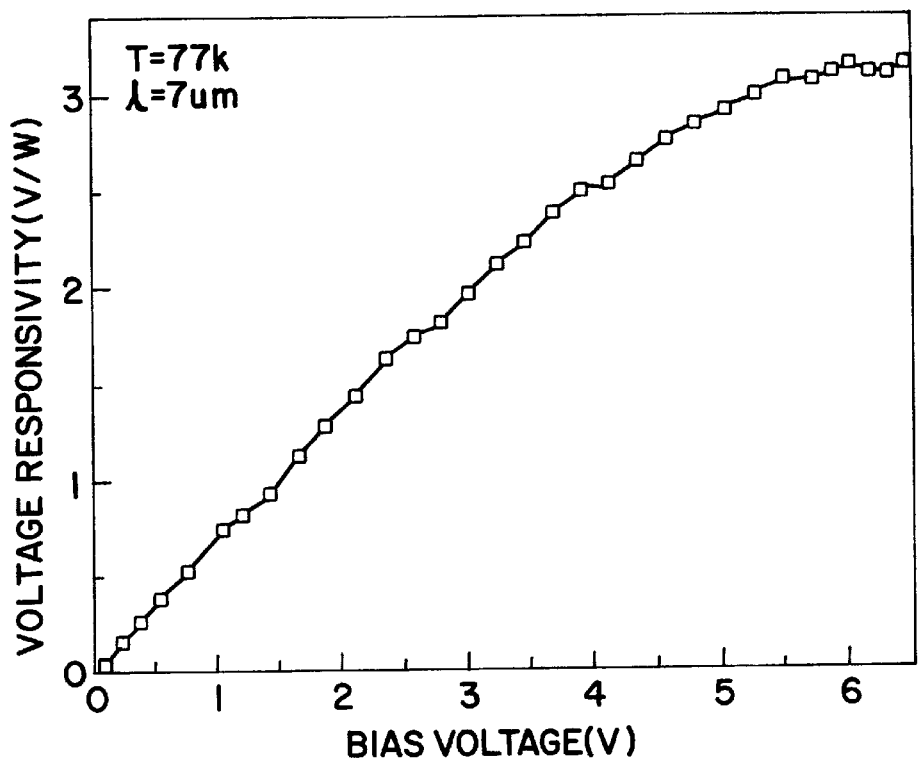
FIG. 3 shows the bias voltage dependent responsivity of the InSbBi photodetector at 77 K.

The carrier lifetime of the fabricated LWIR detector is estimated form the voltage-dependent responsivity measurements shown in FIG. 3. The voltage responsivity R, at an incident wavelength λ under the bias voltage $v_b$ can be expressed as $$R_v = \frac{q\lambda}{hc} \frac{\eta \tau \mu_e V_b R_D}{L^2} \left(1 + \frac{1}{b}\right) \quad (4)$$

where q is the election charge, η is the quantum efficiency, h is the Planck's constant, c is the light velocity, $\mu_e$ is the electron mobility, $V_b$ is the bias voltage, $R_D$ is the detector resistance, L is the detector length, and b is the electron-to-hole mobility ratio. The measured responsivity increases linearly with bias voltage as Eq. (1) predicts, saturates at a bias voltage of 5.5 V, and finally decreases. This saturation behavior of responsivity can be explained by the minority carrier sweep-out at the electrode at high bias filed. The quantum efficiency η can be obtained by $$\eta = (1-r)\frac{(1-e^{-\alpha\tau})}{(1-re^{-\alpha\tau})'} \quad (5)$$

where r is the reflectivity, α is the absorption coefficient, and t is the detector thickness. Using η=0:21 obtained from infrared transmission measurements, the carrier lifetime-mobility product calculated from the slope of the linear portion of FIG. 3 is found to be $\tau\mu_e = 2.35 \times 10^{-4}$ cm$^2$/V. Based on the measured mobility data, the carrier lifetime in a $InSb_{0.95}Bi_{0.05}$ photodetector was estimated to be about 86 ns at 77K. This carrier lifetime is comparable to other III–V long-wavelength infrared deflector based on InTiSb. The InSbBi detector performance at room temperature is listed in Table 1. In spite of the large lattice mismatch between InSbBi and GaAs, the InSbBi photodetectors exhibited good characteristics at room temperature. The detector performance could be further improved by employing previously developed technologies for II–VI uncooled detectors such as optical immersion, resonant optical cavity, and suppression of Auger recombination.

In summary, large Bi incorporation up to 5.8 at. % in InSbBi was achieved by the LP-MOCVD technique. Clearly resolved x-ray diffraction peaks suggest good crystal quality of epitaxial layers. Photoresponse measurements demonstrate the reduction of energy band gap down to 0.13 eV at 77K.

Thus, the subject invention includes 8–12 µm InSbBi long-wavelength infrared photodetectors. The InSbBi/InSb heterostructures grown on GaAs by LP-MOCVD, result in a voltage responsivity at 10.6 µm at about 1.9 mV/W at room temperature and the corresponding Johnson noise limited detectivity was about $1.2 \times 10^6$ cmHz$^{1/2}$/W. The carrier lifetime was estimated to be about 0.7 ns from the bias voltage dependent responsivity measurements.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the claims.

I claim:

1. A detector structure comprising:
   a) substrate;
   b) a buffer layer on said substrate;
   c) an active layer of $InSb_x Bi_{1-x}$ (x=0→1);
   d) a contact formed on said active layer.

2. The structure of claim 1 wherein said detector has a substrate selected from the group consisting of $Al_2O_3$, SiC, GaAs, Si, MgO, ZnO, $LiGaO_2$, $MgAl_2O_4$, GaN, InSb, InAs, GaSb, and InP.

3. The structure of claim 1 wherein said buffer layer is InSb and is doped with a dopant selected from the group consisting of Mg, Zn, Be, Si, Ge and Sn.

* * * * *